US012348151B2

United States Patent
Ito

(10) Patent No.: US 12,348,151 B2
(45) Date of Patent: Jul. 1, 2025

(54) POWER CONVERTER

(71) Applicant: DENSO CORPORATION, Kariya (JP)

(72) Inventor: Shingo Ito, Kariya (JP)

(73) Assignee: DENSO CORPORATION, Kariya (JP)

( * ) Notice: Subject to any disclaimer, the term of this patent is extended or adjusted under 35 U.S.C. 154(b) by 182 days.

(21) Appl. No.: 17/969,143

(22) Filed: Oct. 19, 2022

(65) Prior Publication Data

US 2023/0038613 A1 Feb. 9, 2023

Related U.S. Application Data

(63) Continuation of application No. PCT/JP2021/010169, filed on Mar. 12, 2021.

(30) Foreign Application Priority Data

May 1, 2020 (JP) ................. 2020-081436

(51) Int. Cl.
*H05K 7/14* (2006.01)
*H02M 7/00* (2006.01)

(52) U.S. Cl.
CPC ........ *H02M 7/003* (2013.01); *H05K 7/14329* (2022.08)

(58) Field of Classification Search
CPC ............. H05K 7/14329; H05K 5/0017; H05K 5/0217; H02M 7/03
USPC ........................................ 361/810, 809, 807
See application file for complete search history.

(56) References Cited

U.S. PATENT DOCUMENTS

| | | | | |
|---|---|---|---|---|
| 9,059,603 | B2* | 6/2015 | Douglas | H02J 3/381 |
| 2010/0235031 | A1 | 9/2010 | Yoshida et al. | |
| 2010/0321889 | A1 | 12/2010 | Yoshino et al. | |
| 2015/0029666 | A1* | 1/2015 | Kosuga | H02M 7/003 |
| | | | | 361/699 |
| 2015/0328993 | A1* | 11/2015 | Shin | H05K 7/20927 |
| | | | | 307/10.1 |
| 2017/0305298 | A1 | 10/2017 | Takeshima et al. | |
| 2019/0115848 | A1 | 4/2019 | Okazaki et al. | |
| 2021/0044213 | A1* | 2/2021 | Kojima | H02M 7/003 |

FOREIGN PATENT DOCUMENTS

JP 2013-240158 A 11/2013

\* cited by examiner

*Primary Examiner* — Hung S. Bui
(74) *Attorney, Agent, or Firm* — Oliff PLC

(57) ABSTRACT

A power converter includes a semiconductor unit, a capacitor unit, a first input connector, a second input connector, an output connector, a housing case, a first input bus bar connecting the first input connector and the semiconductor unit, a second input bus bar connecting the second input connector and the semiconductor unit, an output bus bar connecting the semiconductor unit and the output connector, and a bus bar connecting portion at which the first input bus bar and the second input bus bar are connected. The capacitor unit is arranged in a portion of the first input bus bar between the first input connector and the bus bar connecting portion.

10 Claims, 5 Drawing Sheets

POWER CONVERTER

CROSS REFERENCE TO RELATED APPLICATIONS

The present application is a continuation application of International Patent Application No. PCT/JP2021/010169 filed on Mar. 12, 2021, which designated the U.S. and claims the benefit of priority from Japanese Patent Application No. 2020-081436 filed on May 1, 2020. The entire disclosures of all of the above applications are incorporated herein by reference.

TECHNICAL FIELD

The present disclosure relates to a power converter.

BACKGROUND

A power converter includes an interposed portion between a capacitor element and a heat generating component to inhibit the capacitor element from receiving heat from the heat generating component.

SUMMARY

A power converter disclosed herein includes a semiconductor unit, a capacitor unit, a first input connector connected to a first power supply, a second input connector connected to a second power supply, an output connector connected to an electric load, a housing case housing the semiconductor unit and the capacitor unit, a first input bus bar connecting the first input connector and the semiconductor unit, a second input bus bar connecting the second input connector and the semiconductor unit, an output bus bar connecting the semiconductor unit and the output connector, and a bus bar connecting portion at which the first input bus bar and the second input bus bar are connected. The capacitor unit is arranged in a portion of the first input bus bar between the first input bus bar and the bus bar connecting portion.

DESCRIPTION OF EMBODIMENTS

Figure 1:
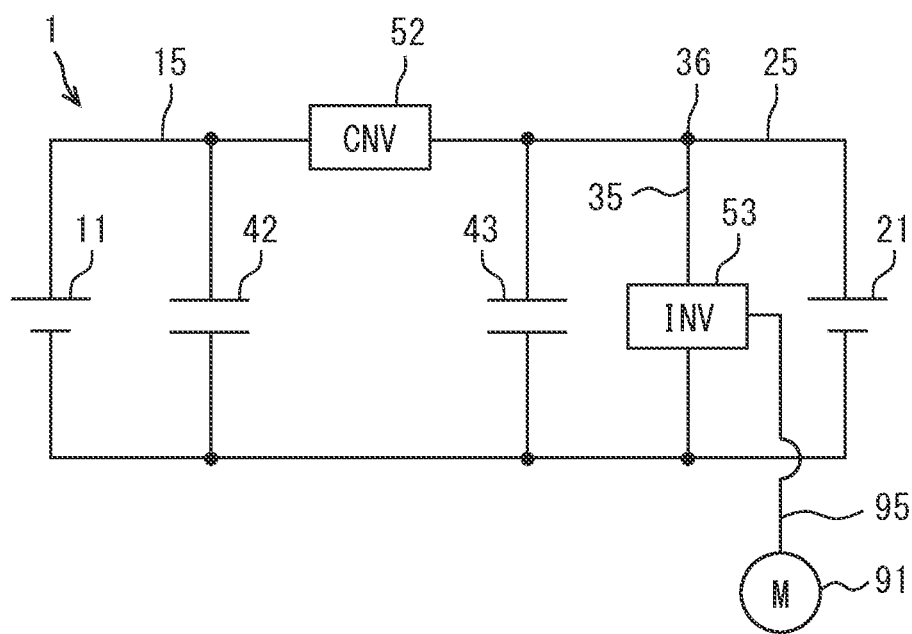
FIG. 1 is an electric circuit diagram illustrating a power supply system.

To begin with, examples of relevant techniques will be described.

A power converter includes an interposed portion between a capacitor element and a heat generating component to inhibit the capacitor element from receiving heat from the heat generating component.

Not only the heat of the heat generating component such as a discharge resistor but also the Joule heat generated when current flows through a bus bar increase the temperature of the capacitor element. In particular, when a plurality of power supplies are provided, a plurality of current paths are also provided, and the capacitor element is easily affected by heat generated in the current paths such as bus bars. Therefore, it is important to reduce the heat received by the capacitor element from the current paths and to inhibit an excessive temperature rise of the capacitor element. From the viewpoint described above or from other unmentioned viewpoints, there is a demand for further improvement to the power converter.

It is an objective of the present disclosure to provide a power converter that can inhibit an excessive temperature rise of a capacitor.

A power converter disclosed herein includes a semiconductor unit, a capacitor unit, a first input connector connected to a first power supply, a second input connector connected to a second power supply, an output connector connected to an electric load, a housing case housing the semiconductor unit and the capacitor unit, a first input bus bar connecting the first input connector and the semiconductor unit, a second input bus bar connecting the second input connector and the semiconductor unit, an output bus bar connecting the semiconductor unit and the output connector, and a bus bar connecting portion at which the first input bus bar and the second input bus bar are connected. The capacitor unit is arranged in a portion of the first input bus bar between the first input bus bar and the bus bar connecting portion.

The disclosed power converter includes the capacitor unit arranged in a portion of the first bus bar between the first input connector and the bus bar connecting portion. Here, when the second power supply supplies power, the second input bus bar generates heat, and the portion of the first input bus bar from the first input connector to the bus bar connecting portion does not generate heat. Thus, the capacitor unit can be provided in a portion that does not generate a large amount of heat when the second power supply supplies power. Therefore, it is possible to inhibit a large amount of Joule heat generated in the current path from the second power supply to the electric load from greatly affecting the capacitor unit. Therefore, it is possible to provide a power convertor that can inhibit an excessive temperature rise of the capacitor unit.

Hereinafter, a plurality of embodiments will be described with reference to the drawings. In some embodiments, functionally and/or structurally corresponding and/or associated parts may be given the same reference numerals, or reference numerals with different digit placed on equal to or higher than a hundred place. For corresponding parts and/or associated parts, additional explanations can be made to the description of other embodiments. Hereinafter, three directions perpendicular to each other are referred to as an X direction, a Y direction, and a Z direction.

First Embodiment

In FIG. 1, a power supply system 1 includes a first power supply 11, a second power supply 21, a converter unit 52, and an inverter unit 53. The first power supply 11 is a secondary battery such as a lithium ion battery. The first power supply 11 is a direct current power supply that outputs a voltage of, for example, about 300 V. However, the first power supply 11 is not limited to a secondary battery such as a lithium ion battery, and the output voltage is not limited to the above example.

The second power supply 21 is, for example, a fuel cell that generates electricity through an electrochemical reaction. The second power supply 21 is a direct current power supply that outputs a voltage higher than that of the first power supply 11. The output voltage of the second power supply 21 is for example, about 700 V. However, the second power supply 21 is not limited to the fuel cell, and the output voltage is not limited to the above example. The power supply system 1 is not limited to a configuration including two power supplies of the first power supply 11 and the second power supply 21. The power supply system 1 may include three or more power supplies. For example, the power supply system 1 may include a third power supply in addition to the first power supply 11 and the second power supply 21.

The converter unit 52 is a unit that converts the magnitude of direct current power. For example, the converter unit 52 boosts the direct current voltage output from the first power supply 11 and converts it into a voltage equivalent to that of the second power supply 21. The inverter unit 53 is a unit that converts direct current power into alternating current power. The inverter unit 53 converts, for example, the input direct current power into three-phase alternating current power. The converter unit 52 and the inverter unit 53 are units that convert the magnitude and frequency of electric power supplied to the outside. The power supply system 1 is not limited to a configuration including the single converter unit 52 and the single inverter unit 53. The power supply system 1 may be configured to include, for example, only either one of the converter unit 52 or the inverter unit 53. Alternatively, the power supply system 1 may include a plurality of converter units 52.

An electric motor 91, which is an electric load, is connected to the power supply system 1. The electric motor 91 is a device that rotates by consuming the electric power output from the first power supply 11 and the second power supply 21. The electric motor 91 is an alternating motor that consumes alternating power generated by the inverter unit 53. The electric load connected to the power supply system 1 is not limited to the electric motor 91, and various electric loads can be connected to the power supply system 1 depending on applications.

The power supply system 1 includes a converter capacitor 42 and an inverter capacitor 43. The converter capacitor 42 is arranged between the first power supply 11 and the converter unit 52. The converter capacitor 42 functions as a filter capacitor that reduces normal mode noise from the first power supply 11. The inverter capacitor 43 is arranged on the input side of the inverter unit 53. The inverter capacitor 43 functions as a smoothing capacitor that smooths the alternating current power output from the inverter unit 53.

The power supply system 1 includes a first input bus bar 15, a second input bus bar 25, and an output bus bar 95. The first input bus bar 15 is a bus bar that forms a current path from the first power supply 11 to the inverter unit 53. The second input bus bar 25 is a bus bar that forms a current path from the second power supply 21 to the inverter unit 53. The first input bus bar 15 and the second input bus bar 25 are connected to each other. The connecting portion between the first input bus bar 15 and the second input bus bar 25 is referred to as a bus bar connecting portion 36. In the first input bus bar 15 and the second input bus bar 25, the portion from the bus bar connecting portion 36 to the electric motor 91 is a common input bus bar 35. The output bus bar 95 is a bus bar that forms a current path from the inverter unit 53 to the electric motor 91.

Figure 2:
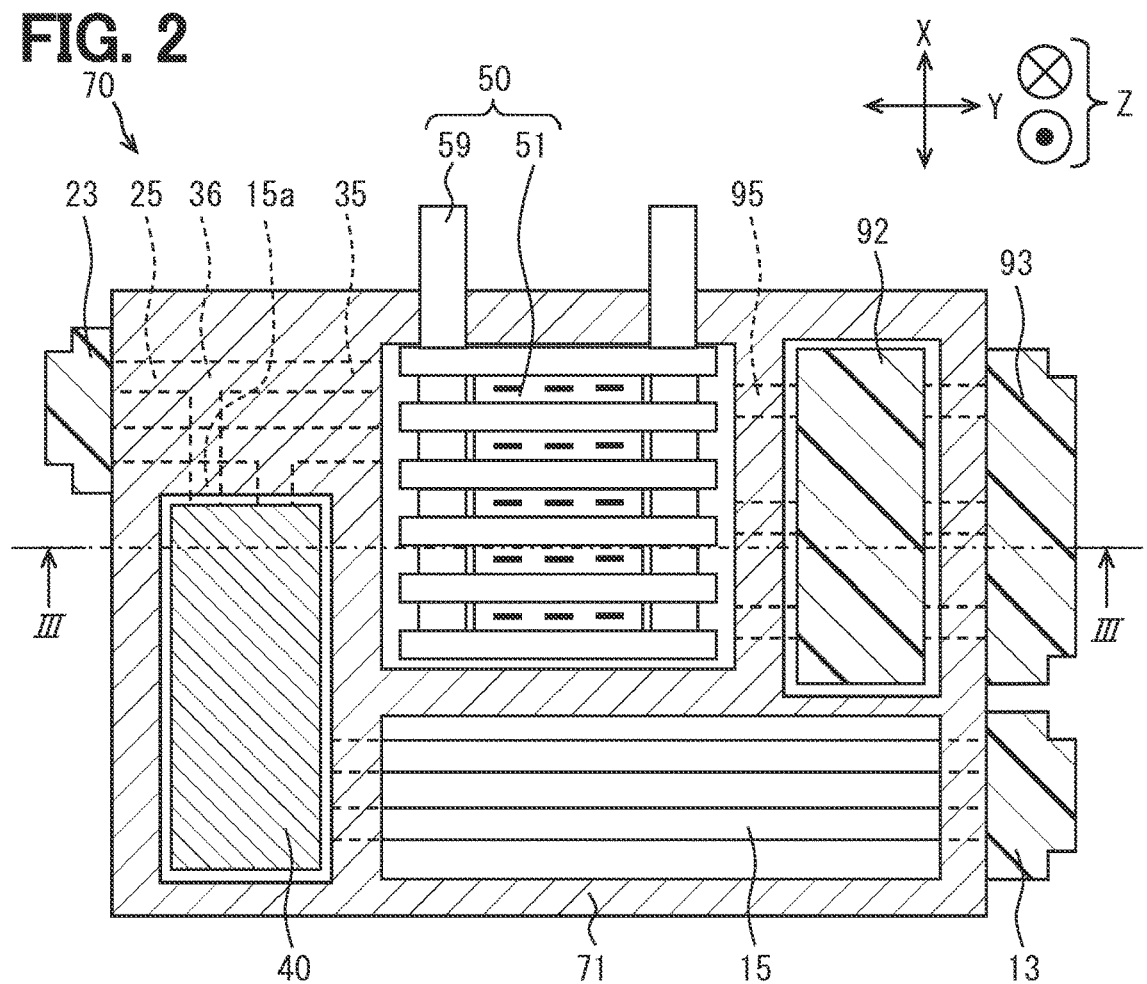
FIG. 2 is a cross-sectional view illustrating a power converter.

In FIG. 2, the X direction corresponds to the front-rear direction, the Y direction corresponds to the right-left direction, and the Z direction corresponds to the up-down direction. The power convertor 70 includes a capacitor unit 40, a semiconductor unit 50, and a housing case 71. The capacitor unit 40 includes the converter capacitor 42 and the inverter capacitor 43. The capacitor unit 40 is configured such that a capacitor element forming the converter capacitor 42 and a capacitor element forming the inverter capacitor 43 are housed in a single case. That is, the capacitor unit 40 includes a plurality of capacitor elements in the single case.

Generally, when the temperature of a capacitor element is too high, the capacitance tends to decrease. Thus, when designing the capacitor unit 40, it is necessary to determine the number of capacitor elements and the capacitance so that the required capacitance can be secured even under a high temperature environment. Therefore, stably inhibiting the abnormal temperature rise of the capacitor unit 40 contributes to reducing the number of capacitor elements. Alternatively, it contributes to reducing the capacitance of one capacitor unit, thereby making it possible to adopt a small sized capacitor element. In summary, it contributes to the compact design of the capacitor unit 40. Therefore, it is very important to suppress an abnormal temperature rise of the capacitor unit 40.

The semiconductor unit 50 includes semiconductor devices 51 and a semiconductor cooler 59. The semiconductor devices 51 include switching elements such as MOSFETs and IGBTs. The semiconductor devices 51 are a heat generating component that generates heat when current flows through the heat generating component. The semiconductor devices 51 have rectangular plate shapes and are arranged side by side. Some semiconductor devices 51 form the converter unit 52. The other semiconductor devices 51 form the inverter unit 53.

The semiconductor cooler 59 is a cooler through which a cooling medium for cooling the semiconductor devices 51 flows. The semiconductor cooler 59 includes two headers each forming a circular annular passage among passages of the cooling medium. The headers extend along an arrangement direction of the plurality of semiconductor devices 51. The two headers pass through the housing case 71 and are exposed to the outside of the housing case 71. The semiconductor cooler 59 includes a plurality of flat tubes. The plurality of tubes define flat passages fluidly in communication with the two headers. The semiconductor devices 51 are sandwiched between the flat tubes so that both surfaces of the semiconductor devices 51 are cooled. The semiconductor cooler 59 is a stacked cooler in which the plurality of flat tubes are stacked with each other.

The housing case 71 is a case for housing the capacitor unit 40 and the semiconductor unit 50 inside. The housing case 71 is a box made of a metal, and the inside of the housing case 71 is partitioned into a plurality of spaces.

A first input connector 13, a second input connector 23, and an output connector 93 are disposed outside the housing case 71. The first input connector 13 is a connector for connecting the first power supply 11 to the power convertor 70. The second input connector 23 is a connector for connecting the second power supply 21 to the power convertor 70. The output connector 93 is a connector for connecting the electric motor 91 to the power convertor 70.

The first input connector 13 and the output connector 93 are arranged on the same side surface of the housing case 71.

On the other hand, the second input connector 23 is arranged on a side surface opposite to the side surface on which the first input connector 13 and the output connector 93 are arranged. Further, each connector is provided on a surface different from the surface through which the headers of the semiconductor cooler 59 protrudes. However, the positional relationship of the connectors is not limited to the above example.

Inside the housing case 71, the first input bus bar 15, the second input bus bar 25, and the output bus bar 95 are arranged. Each bus bar is made of a metal and has a plate shape. The first input bus bar 15 extends from the first input connector 13. The first input bus bar 15 connects the first input connector 13 and the semiconductor devices 51 of the semiconductor unit 50. Through the first input bus bar 15, a direct current output from the first power supply 11 and input into the converter unit 52 flows. The capacitor unit 40 is arranged in the current path of the first input bus bar 15. The capacitor unit 40 is arranged in a side portion of the power converter 70 that is opposite to a portion in which the output connector 93 and the output bus bar 95 are arranged. In other words, the capacitor unit 40 is arranged in a portion of the housing case 71 that includes a position farthest from the output connector 93 and the output bus bar 95.

The second input bus bar 25 extends from the second input connector 23. The second input bus bar 25 connects the second input connector 23 and the semiconductor devices 51 of the semiconductor unit 50. Through the second input bus bar 25, a direct current output from the second power supply 21 and input into the inverter unit 53 flows. The second input bus bar 25 is shorter than the first input bus bar 15. The capacitor unit 40 is not provided in the current path of the second input bus bar 25.

The common input bus bar 35 is a part of the first input bus bar 15 and the second input bus bar 25. Thus, through the common input bus bar 35, a direct current output from both the first power supply 11 and a direct current output from the second power supply 21 flow. The capacitor unit 40 is not arranged in the current path of the common input bus bar 35.

In a current path such as a bus bar, Joule heat is generated according to the magnitude of the current flowing through the current path. The generated Joule heat is radiated to the surroundings through heat transfer to the air inside the housing case 71 or the housing case 71 itself. However, when the flowing current is large or when the current flows for a long time, the generated Joule heat increases. Therefore, the temperature of the bus bar and the temperature around the bus bar tend to be high. Therefore, the common input bus bar 35 tends to generate a large amount of Joule heat as compared to other portions of the first input bus bar 15 and the second input bus bar 25, and the temperature of the common input bus bar 35 tends to be high.

The output bus bar 95 extends from the output connector 93. The output bus bar 95 connects the output connector 93 and the semiconductor unit 50. Through the output bus bar 95, alternating current output from the inverter unit 53 that is a part of the semiconductor unit 50 flows. The output bus bar 95 is formed of three bus bars, and current flows through the three bus bars corresponding to the three phases currents. Since a large amount of current flows through the output bus bar 95, a large amount of Joule heat is generated in the output bus bar 95.

The output bus bar 95 is provided with a current sensor 92. The current sensor 92 is a sensor that detects the current flowing through the output bus bar 95. The current sensor 92 detects the magnitude of the current in each of the three bus bars forming the output bus bar 95.

Figure 3:
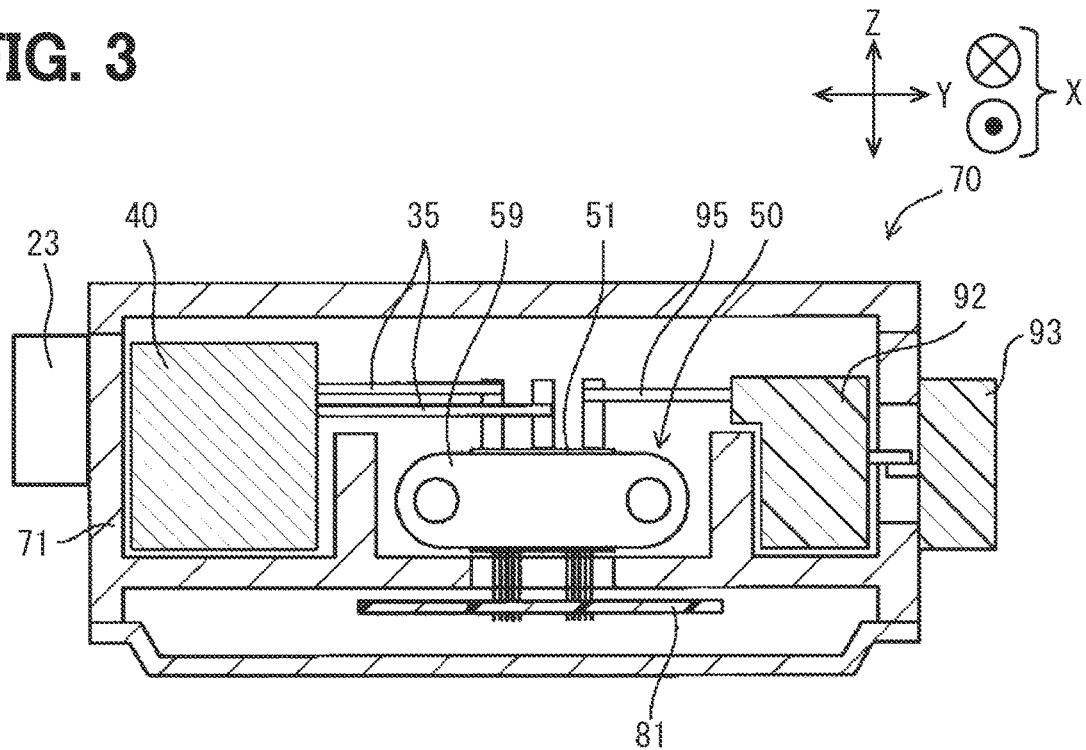
FIG. 3 is a cross-sectional view taken along a line III-III of FIG. 2.

In FIG. 3, the housing case 71 includes a box-shaped main body and a plate-shaped lid. The main body forms the upper surface and the four side surfaces of the housing case 71. The lid forms the bottom surface of the housing case 71.

The capacitor unit 40, the semiconductor unit 50, and the current sensor 92 are disposed in the main body of the housing case 71. A control board 81 is arranged in a space between the main body and the lid of the housing case 71. The control board 81 includes a control unit that controls on/off switching for each semiconductor device 51. The control board 81 and the semiconductor devices 51 are connected to each other with signal lines.

The common input bus bar 35 includes two bus bars of a positive electrode bus bar and a negative electrode bus bar. The common input bus bar 35 is connected to connections terminal extending from the semiconductor devices 51. The output bus bar 95 is connected to a connection terminal extending from the semiconductor devices 51.

Hereinafter, the heat generation in the current path when driving the electric motor 91 will be described with reference to FIG. 2. First, a case where the electric motor 91 is driven by the first power supply 11 will be described. In this case, a large amount of current flows from the first input connector 13 to the output connector 93 through the converter unit 52 and the inverter unit 53. Therefore, a large amount of Joule heat is generated in the first input bus bar 15 and the output bus bar 95.

Further, since the function as a filter capacitor or a smoothing capacitor is exhibited, Joule heat is generated also in the current path from the capacitor unit 40 to the semiconductor unit 50. However, the current flowing for exerting the function of the capacitor unit 40 is sufficiently small compared to a large amount of current supplied from the first power supply 11. Therefore, the Joule heat generated when the capacitor unit 40 functions is sufficiently small compared to the Joule heat generated when the electric motor 91 is driven with the first power supply 11.

In the second input bus bar 25, Joule heat is generated in the portion forming the common input bus bar 35, but Joule heat is not generated in the other portion. However, in the second input bus bar 25, the portion forming the common input bus bar 35 and the other portion are connected to each other. Thus, the Joule heat generated in the common input bus bar 35 is thermally conducted to the entire second input bus bar 25. Therefore, in the second input bus bar 25, the temperature of the common input bus bar 35 tends to be the highest, and the temperature decreases as a distance from the common input bus bar 35 increases.

Since the capacitor unit 40 is arranged in the first input bus bar 15, the Joule heat generated in the first input bus bar 15 has a great influence on the capacitor unit 40. Thus, both the Joule heat generated by the capacitor unit 40 and the Joule heat generated in the first input bus bar 15 affect the capacitor unit 40.

Next, a case where the electric motor 91 is driven by the second power supply 21 will be described. In this case, a large amount of current flows from the second input connector 23 to the output connector 93 through the inverter unit 53. Therefore, a large amount of Joule heat is generated in the second input bus bar 25 and the output bus bar 95.

Further, since the function as a smoothing capacitor is exhibited, Joule heat is also generated in the current path from the capacitor unit 40 to the semiconductor unit 50. However, the current flowing for exerting the function of the capacitor unit 40 is sufficiently small compared to a large amount of current supplied from the second power supply 21. Therefore, the Joule heat generated when the condenser unit 40 functions is sufficiently small compared to the Joule heat generated when the electric motor 91 is driven with the second power supply 21.

In the first input bus bar 15, Joule heat is generated in the portion forming the common input bus bar 35, but Joule heat is not generated in the other portion. However, in the first input bus bar 15, the portion forming the common input bus bar 35 and the other portion are connected to each other. Thus, the Joule heat generated in the common input bus bar 35 is thermally conducted to the entire first input bus bar 15. Therefore, in the first input bus bar 15, the temperature of the common input bus bar 35 tends to be the highest, and the temperature decreases as the distance from the common input bus bar 35 increases.

The capacitor unit 40 is arranged in a portion of the first input bus bar 15 that is not the common input bus bar 35. Therefore, the Joule heat generated in the second input bus bar 25 affects the capacitor unit 40 via a portion of the first input bus bar 15 that is not the common input bus bar 35. In other words, the portion of the first input bus bar 15 from a connection with the capacitor unit 40 to the bus bar connecting portion 36 functions as a temperature rise suppressing portion 15a that suppresses the temperature rise. The temperature rise suppressing portion 15a inhibits the Joule heat generated in the second input bus bar 25 from greatly affecting the capacitor unit 40. The longer the distance of the temperature rise suppressing portion 15a, the higher the effect of suppressing the temperature rise of the capacitor unit 40.

In summary, when the electric motor 91 is driven with the first power supply 11, the Joule heat generated in the first input bus bar 15 has a great thermal effect on the capacitor unit 40. On the other hand, when the electric motor 91 is driven with the second power supply 21, the Joule heat generated in the second input bus bar 25 is reduced by the temperature rise suppressing portion 15a. This reduced heat will affect the capacitor unit 40. Therefore, the temperature of the capacitor unit 40 can be easily kept low as compared with the case where the electric motor 91 is driven with the first power supply 11.

According to the above-described embodiment, the capacitor unit 40 is arranged in the portion of the first input bus bar 15 between the first input connector 13 and the bus bar connecting portion 36. In other words, the capacitor unit 40 is arranged in a portion of the first input bus bar 15 that is not the common input bus bar 35. Therefore, the capacitor unit 40 can be arranged in a portion where a large amount of heat is not generated when the second power supply 21 supplies power. Therefore, it is possible to inhibit a large amount of Joule heat generated in the current path from the second power supply 21 to the electric motor 91 from greatly affecting the capacitor unit 40. Therefore, it is possible to provide the power convertor 70 that suppresses an excessive temperature rise of the capacitor unit 40.

The first input bus bar 15 connects the first input connector 13 and the inverter unit 53 through the converter unit 52. Therefore, the voltage flowing through the current path from the converter unit 52 to the electric motor 91 can be boosted to reduce the current. Therefore, when the electric motor 91 is driven with the first power supply 11, the current flowing in the entire current path from the first power supply 11 to the electric motor 91 can be reduced. Since the total amount of heat generated in the current path when the first power supply 11 supplies power to drive the electric motor 91 can be reduced, the thermal influence on the capacitor unit 40 can be reduced.

The capacitor unit 40 is not arranged in the portion of the first input bus bar 15 from the bus bar connecting portion 36 to the semiconductor unit 50. Therefore, it is possible to inhibit a large amount of Joule heat generated in the current path from the second power supply 21 to the electric motor 91 from greatly affecting the capacitor unit 40. Therefore, it is possible to provide the power convertor 70 that suppresses an excessive temperature rise of the capacitor unit 40.

The first input bus bar 15 is longer than the second input bus bar 25. Further, the first input bus bar 15 is longer than the common input bus bar 35. Thus, in the first input bus bar 15, it is easy to secure a long length of the portion that does not form the common input bus bar 35. Therefore, it is easy to secure a wide area where the capacitor unit 40 can be connected and to secure a high degree of freedom in design.

The second input connector 23 is arranged on a surface of the housing case 71 different from the surface of the housing case 71 on which the first input connector 13 is arranged. Thus, the current path including the first input connector 13 and the current path including the second input connector 23 can be partially separated from each other. Thus, it is easy to position the first input bus bar 15 that generates Joule heat when the first power supply 11 is used away from the second input bus bar 25 that generates Joule heat when the second power supply 21 is used. Therefore, it is easy to disperse the influence of heat generated in a portion of the input side bus bar other than the common input bus bar 35 and to avoid keeping the high temperature of the capacitor unit 40 for a long time.

The second input connector 23 is arranged on a surface of the housing case 71 different from the surface on which the output connector 93 is arranged. Therefore, it is easy to position the second input bus bar 25 that generates joule heat when the second power supply 21 is used away from the output bus bar 95 that generates joule heat regardless of which power supply is used. Therefore, it is easy to disperse the influence of generated heat on the second input bus bar 25 and the output bus bar 95 and to avoid keeping the high temperature of the capacitor unit 40 for a long time.

The output connector 93 is arranged on the same surface of the housing case 71 as the surface on which the first input connector 13 is arranged. Therefore, as compared with the case where the first input connector 13 and the output connector 93 are arranged on different surfaces, it is easy to reduce the number of surfaces of the housing case 71 from which components protrude. Here, when a component such as the first input connector 13 protrudes from the surface of the housing case 71, a dead space is defined around the power convertor 70 by the protruding amount of the component. Therefore, by arranging the output connector 93 on the same surface as the first input connector 13, it is easy to design the power supply system 1 in a compact size by utilizing the dead space of the output connector 93 and the first input connector 13.

Second Embodiment

This embodiment is a modification based on the preceding embodiment. In this embodiment, the second input connector 223 is provided on the surface of the housing case 71 through the headers of the semiconductor cooler 59 protrude.

Figure 4:
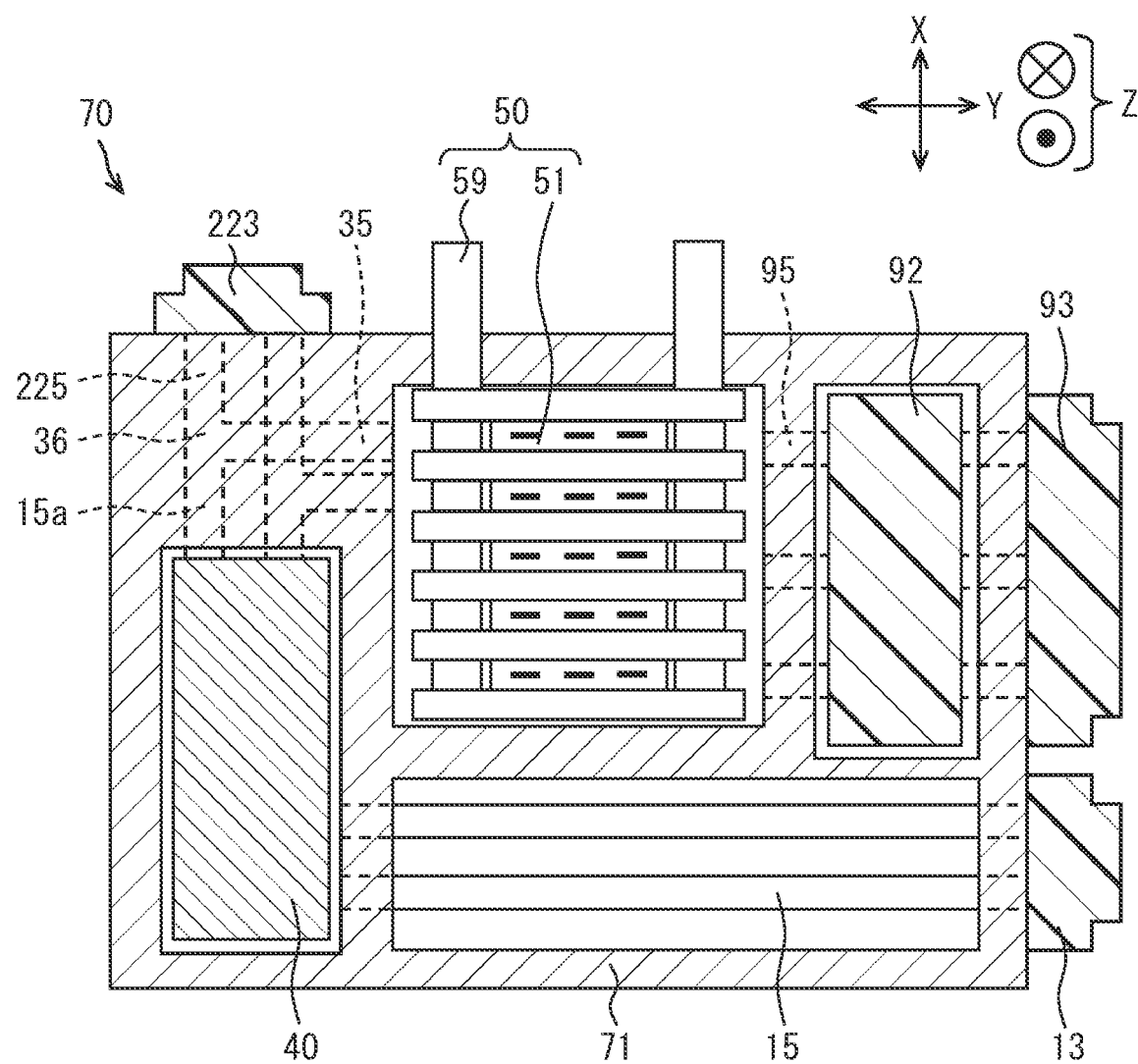
FIG. 4 is a cross-sectional view of a power convertor according to a second embodiment.

In FIG. 4, the second input connector 223 is arranged on the surface of the housing case 71 through which the headers of the semiconductor cooler 59 protrude. In other words, the second input connector 223 and the headers of the semiconductor cooler 59 extend outward from one side surface among the four side surfaces of the housing case 71. Further, the first input connector 13 and the output connector 93 are arranged to protrude outward from the side surface next to this side surface. In summary, components protrude outward from the two side surfaces of the four side surfaces of the housing case 71, but no component protrude outward from the other two side surfaces.

According to the above-described embodiment, the second input connector 223 is arranged on the same surface of the housing case 71 as the surface through which the headers of the semiconductor cooler 59 protrude. Therefore, the second input connector 223 and the second input bus bar 225 can be arranged at a position close to the semiconductor cooler 59. Thus, the second input bus bar 225 can be more effectively cooled by the semiconductor cooler 59. Therefore, it is easy to keep the temperature of the second input bus bar 225 low. Further, it is possible to prevent the temperature of the capacitor unit 40, which is connected to the second input bus bar 225 through a part of the first input bus bar 15, from rising excessively. Further, a dead space generated by the protruding headers of the semiconductor cooler 59 can be effectively utilized.

Third Embodiment

This embodiment is a modification based on the preceding embodiment. In this embodiment, the capacitor unit 340 is formed of two units that is a first capacitor unit 340a and a second capacitor unit 340b.

Figure 5:
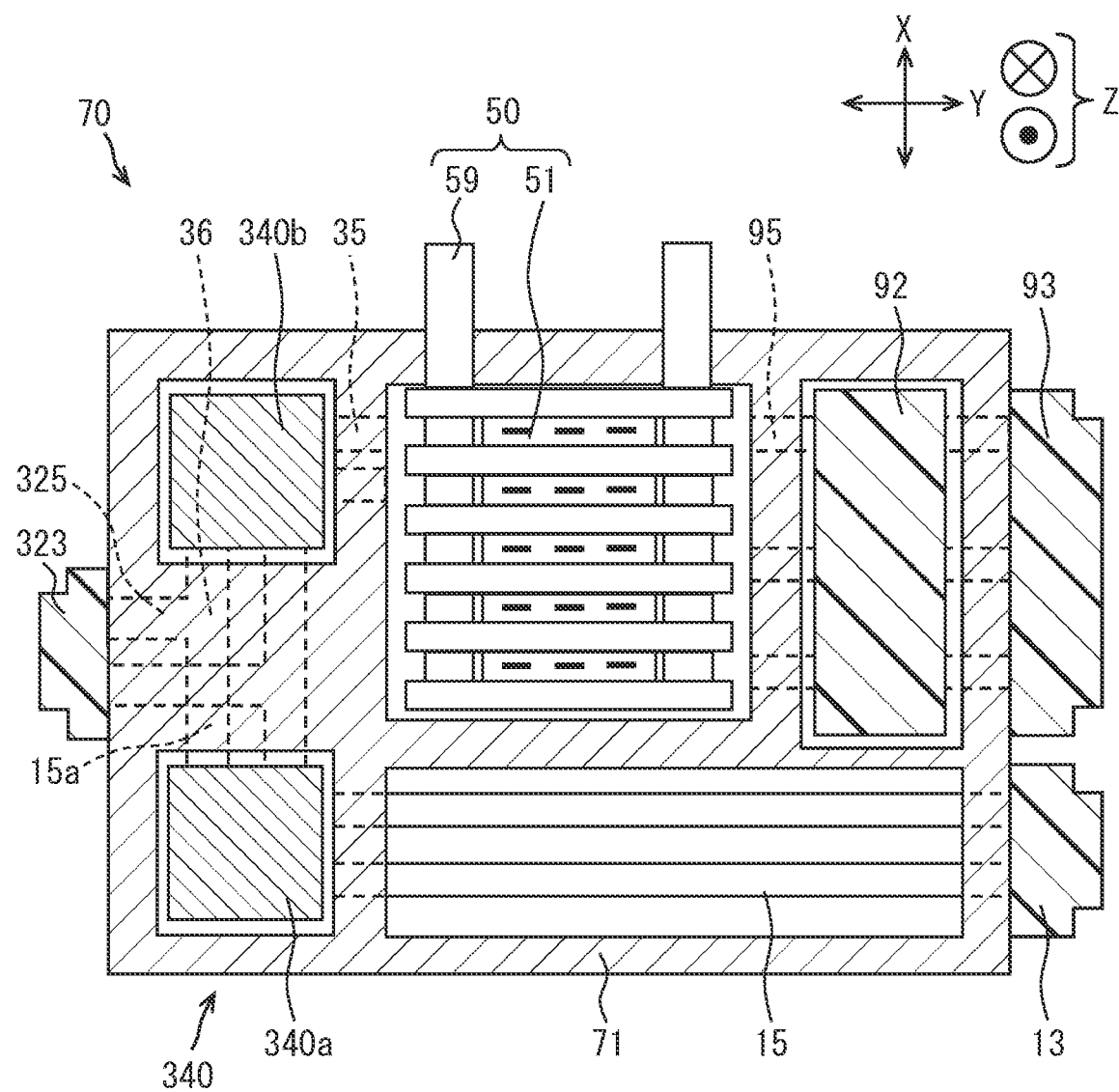
FIG. 5 is a cross-sectional view of a power convertor according to a third embodiment.

In FIG. 5, the power convertor 70 includes the capacitor unit 340. The capacitor unit 340 includes two units that is a first capacitor unit 340a and a second capacitor unit 340b. The first capacitor unit 340a is arranged in the portion of the first input bus bar 15 from the first input connector 13 to the bus bar connecting portion 36. The second capacitor unit 340b is arranged in the portion of the first input bus bar 15 from the bus bar connecting portion 36 to the semiconductor unit 50. In summary, the first capacitor unit 340a is arranged in a portion of the first input bus bar 15 that is not the common input bus bar 35. On the other hand, the second capacitor unit 340b is arranged in a portion of the first input bus bar 15 that forms the common input bus bar 35.

When the first input connector 13 supplies power, both the first capacitor unit 340a and the second capacitor unit 340b are greatly affected by the Joule heat generated in the first input bus bar 15. On the other hand, when the second input connector 323 supplies power, only the second capacitor unit 340b is greatly affected by the Joule heat generated in the second input bus bar 325. In this way, the magnitude of the thermal effect on the first capacitor unit 340a can be controlled depending on which input connector supplies power, the first input connector 13 or the second input connector 323.

According to the above-described embodiment, the capacitor unit 340 includes the first capacitor unit 340a and the second capacitor unit 340b. Here, the first capacitor unit 340a is arranged in the portion of the first input bus bar 15 from the first input connector 13 to the bus bar connecting portion 36. On the other hand, the second capacitor unit 340b is arranged in the portion of the first input bus bar 15 from the bus bar connecting portion 36 to the semiconductor unit 50. In other words, the first capacitor unit 340a is arranged in a portion of the first input bus bar 15 outside of the common input bus bar 35. On the other hand, the second capacitor unit 340b is arranged in a portion of the first input bus bar 15 that forms the common input bus bar 35. Therefore, for the first capacitor unit 340a, a capacitor element having lower heat resistance performance and heat dissipation performance than the second capacitor unit 340b can be used. Therefore, the capacitor unit 340 can be configured by combining capacitor elements having various characteristics. In other words, it is easy to increase the degree of freedom in designing the capacitor unit 340.

Fourth Embodiment

This embodiment is a modification based on the preceding embodiment. In this embodiment, the capacitor unit 440 is arranged below the semiconductor unit 50. Further, the first input connector 413 and the output connector 493 are provided on the upper surface of the housing case 71.

Figure 6:
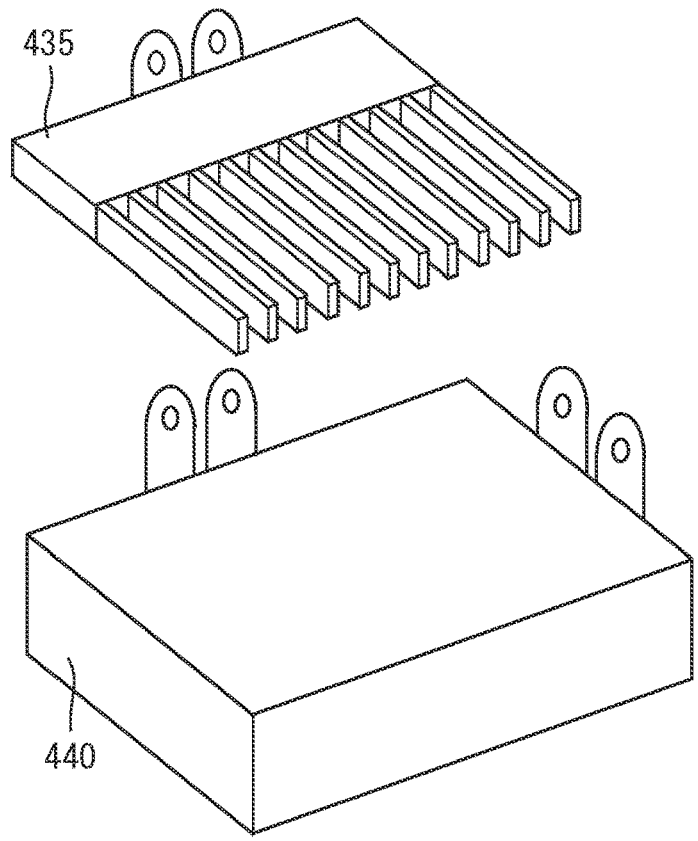
FIG. 6 is a perspective view illustrating a capacitor unit and a common input bus bar according to a fourth embodiment.

In FIG. 6, the capacitor unit 440 includes a connection terminal for a connection with the first input bus bar 415 and a connection terminal for a connection with the common input bus bar 435. The common input bus bar 435 includes a connection terminal for a connection with the capacitor unit 440. The common input bus bar 435 has a comb shape in which a plurality of flat plate portions protrude from a base portion. Here, the base portion of the common input bus bar 435 is connected to the power supply side, and the flat plate portions are connected to the load side. The common input bus bar 435 will be arranged above the capacitor unit 440.

Figure 7:
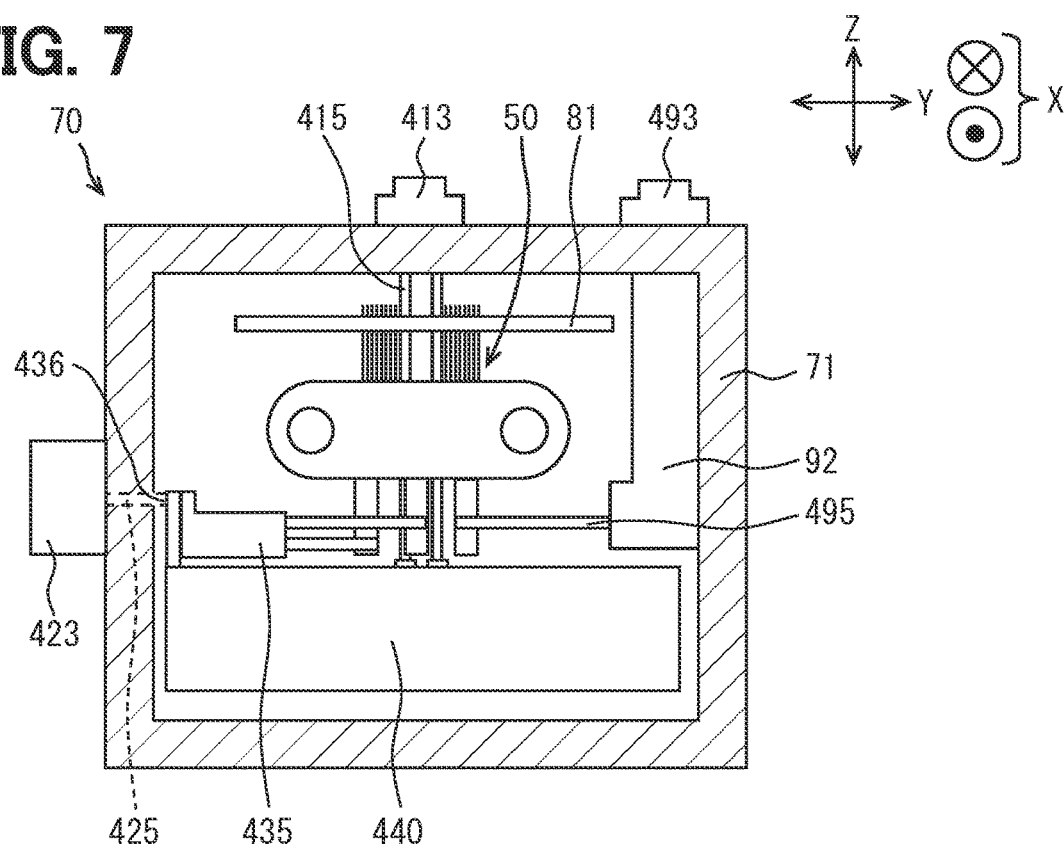
FIG. 7 is a cross-sectional view of a power convertor according to the fourth embodiment.

As shown in FIG. 7, inside the housing case 71, the capacitor unit 440, the semiconductor unit 50, and the control board 81 are arranged in a height direction of the power converter 70 in this order from the bottom surface to the upper surface of the housing case 71. The second input bus bar 425 and the common input bus bar 435 are located between the condenser unit 440 and the semiconductor unit 50 in the height direction (i.e., the up-down direction).

The first input connector 413 is arranged on the upper surface of the housing case 71. The first input bus bar 415 extends downward from the first input connector 413. The first input bus bar 415 is connected to the capacitor unit 440.

The second input connector 423 is arranged on the side surface of the housing case 71. The second input bus bar 425 extends from the second input connector 423 into the housing case 71. The second input bus bar 425 is connected to the connection terminal of the capacitor unit 440 and the connection terminal of the common input bus bar 435. A portion of the second input bus bar 425 connected to the first input bus bar 415 forms the bus bar connecting portion 436.

The output connector 493 is arranged on the upper surface of the housing case 71. The output bus bar 495 extends downward from the output connector 493 and bends toward the semiconductor unit 50. The output bus bar 495 is connected to the semiconductor unit 50. The output bus bar 495 is provided with the current sensor 92. The current sensor 92 is provided in a portion of the output bus bar 495 that extends along the up-down direction.

In the power convertor 70, the device that generates heat the most is the semiconductor devices 51. Therefore, the air around the semiconductor devices 51 is likely to be heated. On the other hand, air is cooled around the semiconductor cooler 59 that cools the semiconductor devices 51. Here, air having a high temperature has a lower density than air having a low temperature, and tends to move upward. Further, air having a low temperature has a higher density than air having a high temperature, and tends to move downward. In summary, air having a high temperature tends to move toward an upper portion of the semiconductor unit 50, and air having a low temperature tends to move toward a lower portion of the semiconductor unit 50. Therefore, air cooled by the semiconductor cooler 59 is likely to move toward the condenser unit 440.

According to the above-described embodiment, the second input bus bar 425 is located between the semiconductor unit 50 and the capacitor unit 440 in the height direction. Therefore, air heated by the Joule heat generated in the second input bus bar 425 tends to move in a direction away from the capacitor unit 440. Therefore, it is easy to reduce the influence of the heat generated in the second input bus bar 425 on the capacitor unit 440.

The capacitor unit 440 is arranged below the semiconductor unit 50. Therefore, air heated by the heat generated by the semiconductor devices 51 tends to move in a direction away from the capacitor unit 440. Further, air cooled by the semiconductor cooler 59 tends to move in a direction toward the capacitor unit 440. Therefore, it is easy to keep the temperature of the capacitor unit 440 low.

Other Embodiments

The disclosure in this specification, the drawings, and the like is not limited to the illustrated embodiments. The disclosure encompasses the illustrated embodiments and variations thereof by those skilled in the art. For example, the present disclosure is not limited to the combinations of components and/or elements shown in the embodiments. The present disclosure may be implemented in various combinations. The present disclosure may have additional members which may be added to the embodiments. The disclosure encompasses omission of components and/or elements of the embodiments. The disclosure encompasses the replacement or combination of components and/or elements between one embodiment and another. The disclosed technical scope is not limited to the description of the embodiments. It should be understood that some disclosed technical ranges are indicated by description of claims, and includes every modification within the equivalent meaning and the scope of description of claims.

The disclosure in the specification, drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

What is claimed is:

1. A power converter comprising:
a semiconductor unit;
a capacitor unit;
a first input connector connected to a first power supply;
a second input connector connected to a second power supply;
an output connector connected to an electric load;
a housing case housing the semiconductor unit and the capacitor unit;
a first input bus bar connecting the first input connector and the semiconductor unit;
a second input bus bar connecting the second input connector and the semiconductor unit;
an output bus bar connecting the semiconductor unit and the output connector; and
a connecting portion at which the first input bus bar and the second input bus bar connect, wherein
the capacitor unit is arranged in a portion of the first input bus bar between the first input connector and the connecting portion.

2. The power converter according to claim 1, wherein the semiconductor unit includes a converter unit and an inverter unit, and
the first input bus bar connects the first input connector and the inverter unit through the converter unit.

3. The power converter according to claim 1, wherein the capacitor unit includes:
a first capacitor unit arranged in a portion of the first input bus bar between the first input connector and the connecting portion; and
a second capacitor unit arranged in a portion of the first input bus bar between the connecting portion and the semiconductor unit.

4. The power converter according to claim 1, wherein the capacitor unit is not arranged in a portion of the first input bus bar between the connecting portion and the semiconductor unit.

5. The power converter according to claim 1, wherein the first input bus bar is longer than the second input bus bar.

6. The power converter according to claim 1, wherein the capacitor unit is arranged below the semiconductor unit in a height direction of the power converter, and
the second input bus bar is located between the semiconductor unit and the capacitor unit in the height direction.

7. The power converter according to claim 1, wherein the second input connector is located on a surface of the housing case that is different from a surface of the housing case on which the first input connector is located.

8. The power converter according to claim 1, wherein the output connector is located on a surface of the housing case that is the same as a surface of the housing case on which the first input connector is located.

9. The power converter according to claim 1, wherein the semiconductor unit is configured to be supplied with electric power from the first power supply through the first input bus bar and from the second power supply through the second input bus bar.

10. The power converter according to claim 1, wherein the second power supply is configured to output higher voltage than the first power supply.

* * * * *